US008253012B2

(12) United States Patent
Gessert et al.

(10) Patent No.: US 8,253,012 B2

(45) Date of Patent: Aug. 28, 2012

(54) HIGH QUALITY TRANSPARENT CONDUCTING OXIDE THIN FILMS

(75) Inventors: Timothy A. Gessert, Conifer, CO (US); Joel N. Duenow, Golden, CO (US); Teresa Barnes, Evergreen, CO (US); Timothy J. Coutts, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 311 days.

(21) Appl. No.: 12/441,707

(22) PCT Filed: Mar. 17, 2008

(86) PCT No.: PCT/US2008/057244

§ 371 (c)(1), (2), (4) Date: Mar. 17, 2009

(87) PCT Pub. No.: WO2009/116990

PCT Pub. Date: Sep. 24, 2009

(65) Prior Publication Data

US 2010/0171082 A1 Jul. 8, 2010

(51) Int. Cl.
*H01B 1/08* (2006.01)
*H01L 31/0224* (2006.01)
*H01L 35/14* (2006.01)

(52) U.S. Cl. .................................. 136/256; 252/519.51

(58) Field of Classification Search ............... 252/518.1, 252/519.51, 520.21; 428/930; 136/252–256
See application file for complete search history.

(56) References Cited

U.S. PATENT DOCUMENTS 4,395,467 A 7/1983 Vossen, Jr. et al.
5,922,142 A 7/1999 Wu
6,042,752 A 3/2000 Mitsui
6,137,048 A 10/2000 Wu
6,180,870 B1 * 1/2001 Sano et al. .................... 136/258
6,246,071 B1 6/2001 Qadri et al.
6,569,548 B2 5/2003 Yamamoto et al.
6,606,333 B2 * 8/2003 Kadota ...................... 372/45.01
6,677,063 B2 1/2004 Finley
6,685,623 B2 2/2004 Presthus et al.
6,733,895 B2 * 5/2004 Kadota et al. ................. 428/469
6,787,253 B2 9/2004 Iwabuchi et al.
6,852,623 B2 2/2005 Park et al.

(Continued)

FOREIGN PATENT DOCUMENTS

CN 101037795 9/2007

OTHER PUBLICATIONS

Miyata, T. et al., New transparent conducting thin films using multicomponent oxides composed of ZnO and V2O5 prepared by magnetron sputtering, Thin Solid Films, vol. 411, (2002) 76-81.

(Continued)

*Primary Examiner* — Mark Kopec

(74) *Attorney, Agent, or Firm* — Paul J. White; John C. Stolpa; W. LaNelle Owens

(57) ABSTRACT

A transparent conducting oxide (TCO) film comprising: a TCO layer, and dopants selected from the elements consisting of Vanadium, Molybdenum, Tantalum, Niobium, Antimony, Titanium, Zirconium, and Hafnium, wherein the elements are n-type dopants; and wherein the transparent conducting oxide is characterized by an improved electron mobility of about 42 $cm^2$/V-sec while simultaneously maintaining a high carrier density of ~$4.4e\times10^{20}$ $cm^{-3}$.

7 Claims, 4 Drawing Sheets

U.S. PATENT DOCUMENTS

| | | | | |
|---|---|---|---|---|
| 6,908,782 | B2 | 6/2005 | Yan et al. | |
| 6,936,761 | B2 | 8/2005 | Pichler | |
| 7,071,121 | B2 | 7/2006 | Punsalan et al. | |
| 7,186,465 | B2 | 3/2007 | Bright | |
| 7,699,965 | B2 * | 4/2010 | Ikisawa et al. | 204/298.02 |
| 7,727,910 | B2 * | 6/2010 | Ahn et al. | 438/785 |
| 2002/0036286 | A1 | 3/2002 | Ho et al. | |
| 2005/0062134 | A1 * | 3/2005 | Ho et al. | 257/614 |
| 2006/0118406 | A1 | 6/2006 | Delahoy | |
| 2007/0007125 | A1 | 1/2007 | Krasnov | |
| 2007/0116986 | A1 * | 5/2007 | Garg et al. | 428/701 |
| 2008/0296569 | A1 * | 12/2008 | Ho et al. | 257/43 |
| 2009/0197757 | A1 * | 8/2009 | Fukushima | 501/127 |
| 2009/0297886 | A1 | 12/2009 | Gessert et al. | |
| 2011/0084239 | A1 | 4/2011 | Gessert et al. | |

OTHER PUBLICATIONS

Tamura, K et al., Donor-acceptor pair luminescence in nitrogen-dopoed ZnO films grown on lattice-matched ScAlMgO4 (0001) substrates, Solid State Communications 127 (2003) 265-269.

Kaminska, E. et al., Properties of p-Type ZnO Grown by Oxidation of Zn-Group-V Compounds, Mater. Res. Soc. Symp. Proc. vol. 957 (2007) 121-126.

Wang, H. et al., Growth of p-type ZnO thin films by (N, Ga) co-doping using DMHy dopant, J. Phys. D: Appl. Phys. 40, (2007) 4682-4685.

Tompa, G.S. et al., A comparative study of MOCVD produced Zno films doped with N, As, P and Sb, Mater. Res. Soc. Symp. Proc. vol. 957 (2007) 283-287.

PCT/US08/57244, PCT International Search Report.

NREL PCT/04-11, PCT/US2007/060553 International Search Report Patent Family Members.

U.S. Appl. No. 11/718,628 USPTO Restriction Requirement, Dated Feb. 25, 2011.

U.S. Appl. No. 11/718,628 USPTO Non-Final Office Action, Dated Apr. 1, 2011.

U.S. Appl. No. 11/718,628 USPTO Final Rejection, Dated Sep. 19, 2011.

U.S. Appl. No. 12/130,788 USPTO Restriction Requirement, Dated Aug. 1, 2011.

U.S. Appl. No. 12/130,788 USPTO Non-Final Office Action, Dated Sep. 2, 2011.

* cited by examiner

HIGH QUALITY TRANSPARENT CONDUCTING OXIDE THIN FILMS

CONTRACTUAL ORIGIN

The United States Government has rights in this invention under Contract No. DE-AC3699G010337 between the United States Department of Energy and the National Renewable Energy Laboratory, a division of the Midwest Research Institute.

BACKGROUND

The present subject relates to high quality doped transparent conducting oxide thin films. ZnO is a known transparent conducting oxide (TCO) material that is an important material in flat-panel displays and photovoltaic systems due to its high conductivity and transmission combined with relatively low cost. Zinc oxide is also very important due to the fact that it does not contain (scarce) indium or toxic cadmium and is amenable to scalable low-temperature deposition processes.

For example, U.S. Pat. No. 6,787,253 disclose a transparent electroconductive film having a polymer film and a transparent electroconductive layer deposited on the polymer film, wherein the electroconductive layer is resistant fully to delamination or removal and the electroconductive film has good electrical characteristics and good durability, and touch panels may be provided with the transparent electroconductive film. With reference to the transparent electroconductive layer deposited on the polymer film, transparent conductive oxide layer made of ITO (indium tin oxide), ATO (antimony tin oxide). ZnO, ZnO doped with Al, $SnO_2$ may be used.

U.S. Pat. No. 6,685,623 discloses a method for manufacturing a zinc oxide semiconductor comprising the steps of forming a zinc oxide thin film including a Group 5 element as a dopant on a substrate by using a zinc oxide compound containing a Group 5 element or an oxide thereof, charging the substrate having the zinc oxide thin film formed thereon into a chamber for thermal annealing, and thermal annealing the substrate in the chamber to activate the dopant, thereby changing the zinc oxide thin film exhibiting n-type electrical properties or insulator properties to a zinc oxide thin film exhibiting p-type electrical properties. Since a zinc oxide thin film exhibiting n-type electrical properties can be changed to a zinc oxide thin film exhibiting p-type electrical properties, the provision of holes required for optical devices is facilitated, thereby enabling the development of photoelectric devices such as light-emitting diodes, laser diodes and UV sensors and further extending applicability of the zinc oxide semiconductor.

U.S. Pat. No. 6,569,548 disclose a transparent conductive film of zinc oxide, comprising a zinc oxide layer, and dopants doped into the zinc oxide layer, wherein the dopants have an n-type dopant and a p-type dopant, and the n-type dopant is more than the p-type dopant and doped into the zinc oxide layer in an impurity density of $1\times10^{18}$ $cm^{-3}$ or more. The transparent conductive film is at least one kind of element selected from the group consisting of elements of Group IIIB and elements of Group 5B, and the p-type dopant is at least one kind of element selected from the group consisting of elements of Group 5B and elements of Group 1A.

T. Miyata et al., Thin Solid Films, Vol. 411, pp. 76-81, 2002, disclose Fabrication of ZnO films with a Group 5B element as dopant but using d.c. magnetron sputtering, loose calcined power targets, and pure-argon sputtering ambient. Miyata et al. reports that their minimum resistivity (i.e., $5.3\times10^{-4}$ Ohm-cm) is achieved at a mobility and carrier density of ~35 $cm^2$/V-sec and $3\times10^{20}$ $cm^{-3}$, respectively. Miyata reports that higher mobility is achieved only for lower carrier density.

There is a need in the area of transparent conducting oxide materials to have materials with an electron mobility significantly higher than that of the present state of the art, and yet simultaneously maintain high carrier density, and as good or better resistance to chemical corrosion than present state of the art transparent conducting oxide materials.

There is further a need to have TCO materials that are less sensitive to variation in oxygen content of the sputtering ambient because this can lead to non-uniformity in the electrical and optical properties of the film when deposited in large-area industrial applications.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Incorporation of a multivalent Group 5 (i.e. V) dopant into ZnO produces an n-type material with an electron mobility (42 $cm^2$/V-sec) higher than that of the to present state of the art (~30 $cm^2$/V-sec) while simultaneously maintaining a higher carrier density (4.4c 20 $cm^{-3}$) when grown in the presence of hydrogen. ZnO:V produced by this process is also characterized by higher resistance to chemical corrosion than the present state of the art ZnO.

Incorporation of the multivalent n-type dopant provides high optical transparency, and is consistent with Drude-theory expectations. Although $V_2O_5$ is not commonly thought of as a “high-permittivity” oxide, vanadium is known to induce high permittivity in other metal-oxides at low temperatures.

In the process used to produce the ZnO transparent conducting oxide material, use is made of radio-frequency magnetron sputtering, pressed-powder ceramic targets, and a sputter ambient in which the hydrogen partial pressure is controlled carefully. Oxygen is specifically excluded from the sputtering environment. We note that hydrogen is required to generate the concurrently high carrier density and mobility.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DETAILED DESCRIPTION

Figure 1:
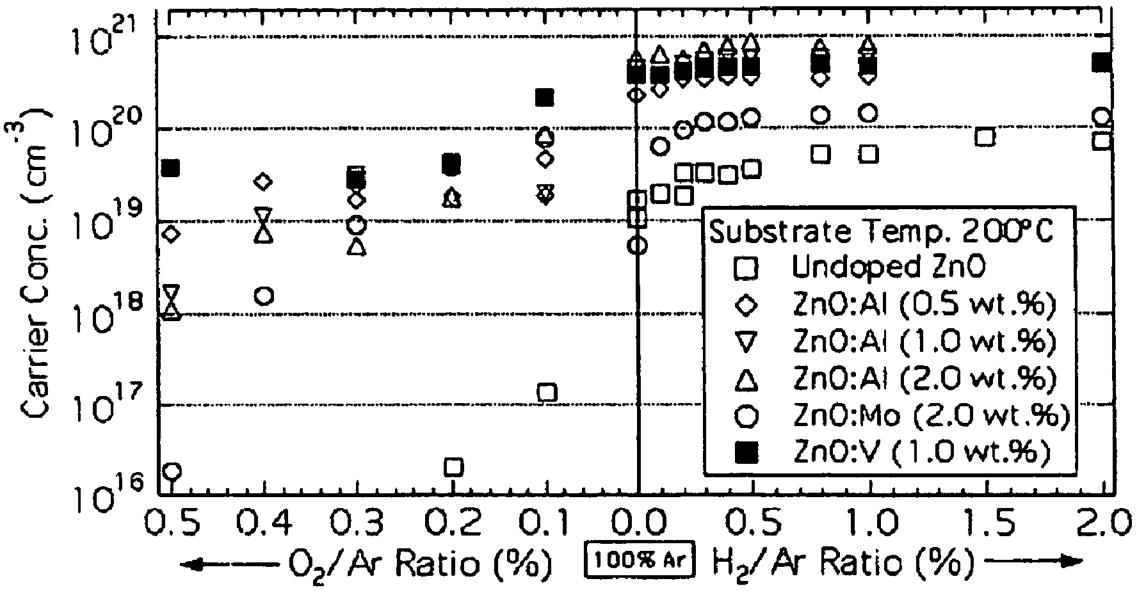
FIG. 1 is a graph depicting carrier density versus the ratio of $O_2$/Ar and $H_2$/Ar in which a multivalent dopant has been incorporated into ZnO in accordance with the present process using radio frequency magnetron sputtering, pressed-powder ceramic targets, and a sputter ambient in which the hydrogen to argon ratio is related to the to carrier density of the transparent conducting ZnO.

The present work is differentiated from the Miyata report because both higher mobility (42 $cm^2$/V-sec) and higher carrier density ($4.4\times10^{20}$ $cm^{-3}$) can be achieved simultaneously through the combined use of V (or another Group-5 dopant) and sputtering in a hydrogen ambient. Further, this can be accomplished using commercially relevant pressed-powder targets.

We have found that the use of certain hydrogen partial pressures in the sputtering ambient while sputter depositing vanadium-doped ZnO enables achievement simultaneously of high mobility (42 $cm^2$/V-sec) and high carrier density ($4.4\times10^{20}$ $cm^{-3}$) in ZnO TCOs. Achieving both parameters simultaneously requires incorporating a controlled amount of hydrogen in the sputtering ambient.

The importance of the change in dielectric permittivity (from the addition of vanadium to the ZnO material) assists in achieving higher mobility and carrier density simultaneously. This result is in comparison to lower-permittivity additions (such as Al in ZnO). This is why our ZnO:V works better than ZnO:Al, but, more importantly, allows one to design TCO material that will be superior to present state of the art TCOs. Specifically, increasing the dielectric permittivity of a TCO moves the onset of scattering by ionized impurities to higher values of carrier density.

We use pressed-powder sputtering targets rather than loose-powder targets, as pressed-powder targets are typically used in commercial production environments, and we use vanadium metal in our targets rather than $V_2O_3$ powders. Further, we achieve significantly lower ZnO:V film resistivity using r.f. sputtering ($3.4\times10^{-4}$ Ohm-cm) than that reported in prior art for d.c. sputtering ($5.3\times10^{-4}$ Ohm-cm).

Use of our process achieves lower resistivity than reported for d.c. sputtering ($5.3\times10^{-4}$ Ohm-cm). Further we achieve these low values of resistivity because of high mobility, whereas prior art achieves minimum resistivity because of high carrier density. It is generally accepted that high mobility is preferred to high carrier density (as high mobility allows for high optical transparency, whereas high carrier density reduces optical transparency).

Deposition of our films is at an elevated substrate temperature (100-300° C.) whereas that of significant prior art is at room temperature.

The TCO materials were prepared by the physical vapor deposition (PVD) technique of r.f. magnetron sputtering. A mixture of ZnO (purity, 99.99%) and V (purity 99.99%) powder were combined in precise ratios and used to produce the pressed powder target. Films were gown by r.f. sputtering with substrate temperature varying from 100-300° C. The carrier density, mobility, resistivity and thickness of the prepared films were determined by well-known prior art measuring methods, and are shown in FIGS. 1 thru 4. All graphs compare data from ZnO:V, ZnO, ZnO:Al, and ZnO:Mo films.

Figure 2:
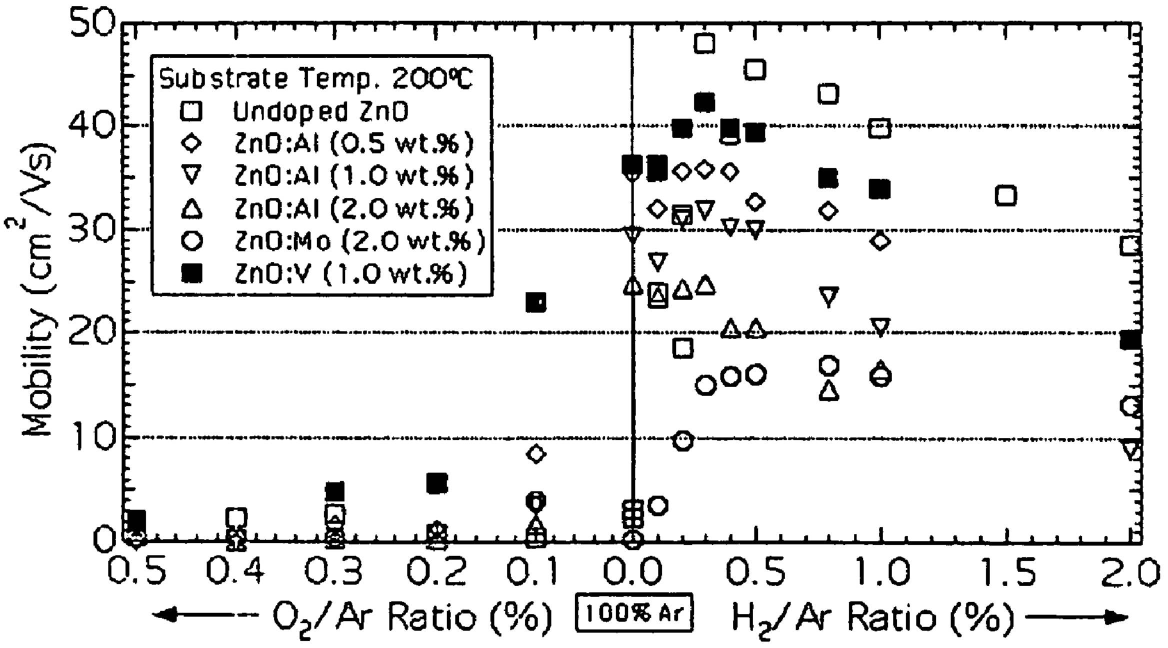
FIG. 2 is a graph depicting electron mobility versus the ratio of $O_2$/Ar and $H_2$/Ar for the transparent conducting ZnO produced by the present process.
Figure 3:
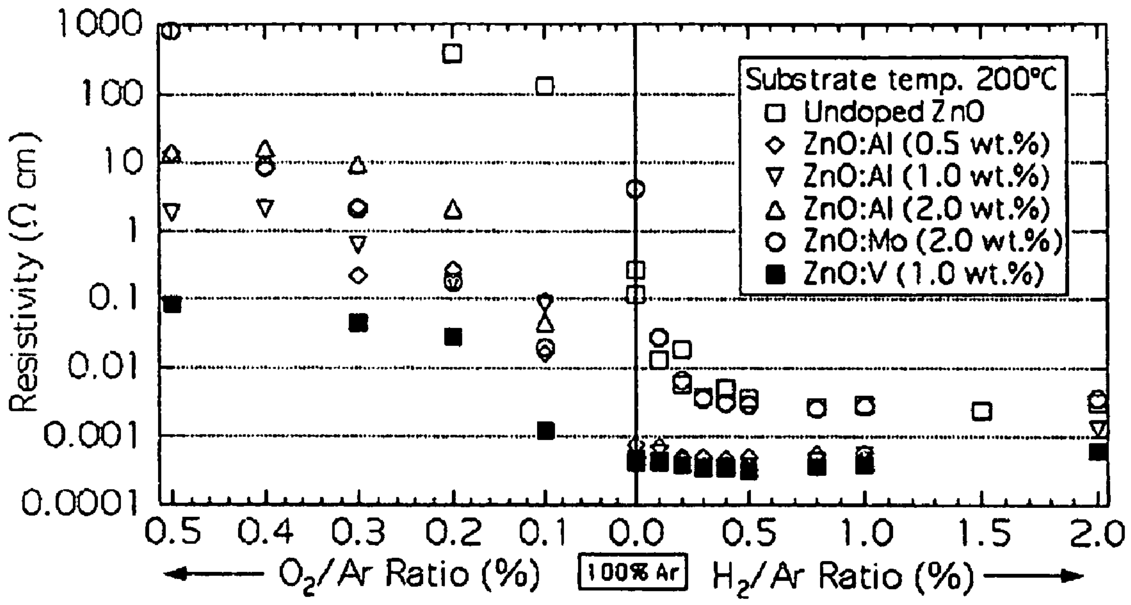
FIG. 3 is a graph depicting resistivity versus the ratio of $O_2$/Ar and $H_2$/Ar for the transparent conducting ZnO materials of the present process.
Figure 4:
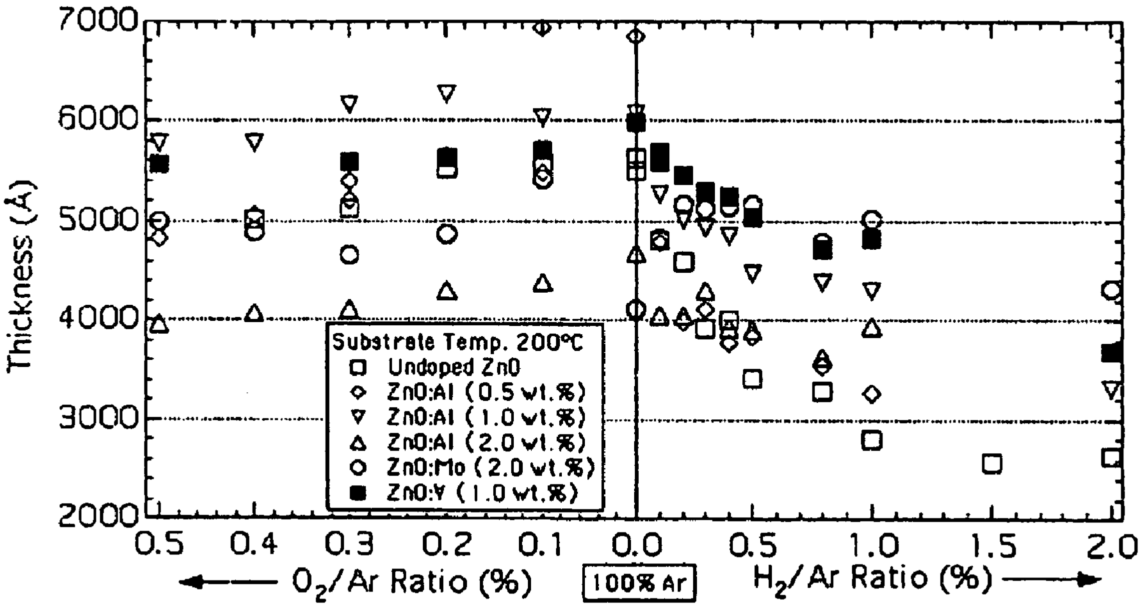
FIG. 4 is a graph depicting thickness versus the ratio of $O_2$/Ar and $H_2$/Ar for the transparent conducting ZnO materials produced by the present process.

Results from the ZnO:V transparent conducting oxide films are indicated by the filled markers; wherein:

FIG. 1 is a graph depicting the ratio of $O_2$/Ar and $H_2$/Ar in Which a multivalent dopant V has been incorporated into ZnO using radio frequency magnetron sputtering, pressed-powder ceramic targets, and a sputter ambient in Which the $O_2$/Ar and $H_2$/Ar ratio is shown to bear a clear connection to the carrier density of the formed transparent conducting ZnO;

FIG. 2 is a graph depicting the ratio of $O_2$/Ar and $H_2$/Ar for the formed multivalent V-doped transparent conducting ZnO and its corollary electron mobility showing not only the importance of careful control of hydrogen to achieve maximum mobility, but that the present process affords higher mobility even for conditions of higher oxygen partial pressure ($O_2$/Ar region of graph);

FIG. 3 is a graph depicting the ratio of $O_2$/Ar and $H_2$/Ar for the formed multivalent V-doped transparent conducting ZnO materials and its corollary resistivity, showing that the present process affords lower resistivity even for conditions of higher oxygen partial pressure ($O_2$/Ar region of graph);

FIG. 4 is a graph depicting the ratio of $O_2$/Ar and $H_2$/Ar for the formed multivalent V-doped transparent conducting ZnO materials and its corollary thickness for the present process.

Other TCOs may also be improved by incorporation of high permittivity dopants or alloy materials. For example, indium oxide may be doped with Mo to produce comparable transparent conducting oxides in the context of this process. Further still, in addition to Vanadium, Tantalum and Niobium and Antimony doped indium oxide is also operable in the context of the present process.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

We claim:

1. A transparent conducting oxide (TCO) film comprising:

a TCO layer formed from:

a sputtered multivalent n-type, pressed-powder ZnO ceramic target containing a dopant selected from the elements consisting of Vanadium, Molybdenum, Tantalum, Niobium, Antimony, Titanium and Zirconium;

wherein the transparent conducting oxide film is characterized by an electron mobility of about 42 $cm^2$/V-sec and a carrier density of about ~$4.4\times10^{20}$ $cm^{-3}$, and wherein the transparent conducting oxide film is part of a photovoltaic device.

2. The transparent conducting oxide claim 1, wherein the multivalent dopant comprises vanadium (V) in a radio-frequency magnetron sputtering process with a sputter ambient of controlled hydrogen partial pressure.

3. A photovoltaic device according to claim 1, wherein the transparent conducting oxide comprises zinc oxide (ZnO) and the sputtered multivalent, n-type pressed powder ceramic dopant target comprises vanadium (V).

4. A thin film material comprising:

a thin transparent conducting oxide layer formed from:

a sputtered multivalent, n-type ZnO pressed-powder ceramic target containing a Group V dopant; wherein the thin film material is formed using the multivalent, n-type, pressed-powder, Group V dopant ceramic target in a sputter ambient environment of hydrogen partial pressure in which oxygen is excluded; wherein the thin film material has a high resistance to chemical corrosion, an electron mobility of about 42 $cm^2$/V-sec and a carrier density of about $4.4\times10^{20}$ $cm^{-3}$, and wherein the thin film material is incorporated in a solar cell device.

5. The thin film material according to claim 4, wherein the dopant comprises vanadium (V).

6. The thin film material according to claim 5, wherein the thin film material is created using a radio frequency magnetron sputtering comprising pressed-powder sputtering targets with vanadium metal.

7. The thin material according to claim 6, wherein the sputtering occurs at a substrate temperature of 100-300° C.

* * * * *